United States Patent
Yang et al.

(10) Patent No.: US 7,671,470 B2
(45) Date of Patent: Mar. 2, 2010

(54) ENHANCED MECHANICAL STRENGTH VIA CONTACTS

(75) Inventors: Chih-Chao Yang, Poughkeepsie, NY (US); Griselda Bonilla, Fishkill, NY (US); Shyng-Tsong Chen, Patterson, NY (US); Kelly Malone, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/179,057

(22) Filed: Jul. 24, 2008

(65) Prior Publication Data

US 2008/0284030 A1 Nov. 20, 2008

Related U.S. Application Data

(63) Continuation of application No. 11/419,077, filed on May 18, 2006, now Pat. No. 7,439,624.

(51) Int. Cl.
*H01L 21/461* (2006.01)

(52) U.S. Cl. .................. 257/748; 257/E23.141

(58) Field of Classification Search ........... 257/734, 257/741, 747, 748, 750–753, 758–760, 762–768, 257/771, 773, 774; 438/622–629
See application file for complete search history.

(56) References Cited

U.S. PATENT DOCUMENTS

| | | | |
|---|---|---|---|
| 5,098,860 | A | 3/1992 | Chakravorty et al. |
| 5,930,669 | A | 7/1999 | Uzoh |
| 5,933,753 | A | 8/1999 | Simon et al. |
| 6,258,707 | B1 * | 7/2001 | Uzoh .................. 438/618 |
| 6,383,920 | B1 | 5/2002 | Wang et al. |
| 6,429,519 | B1 | 8/2002 | Uzoh |
| 6,498,091 | B1 * | 12/2002 | Chen et al. .......... 438/627 |
| 7,282,802 | B2 | 10/2007 | Clevenger |
| 2002/0171147 | A1 | 11/2002 | Yew |
| 2003/0134510 | A1 | 7/2003 | Lee |
| 2003/0203617 | A1 * | 10/2003 | Lane et al. ........... 438/627 |
| 2006/0043588 | A1 * | 3/2006 | Streck et al. ........ 257/751 |

* cited by examiner

*Primary Examiner*—Zandra Smith
*Assistant Examiner*—Paul E Patton
(74) *Attorney, Agent, or Firm*—Joseph Petrokaitis

(57) ABSTRACT

The present invention provides an enhanced interconnect structure with improved reliability. The inventive interconnect structure has enhanced mechanical strength of via contacts provided by embedded metal liners. The embedded metal liners may be continuous or discontinuous. Discontinuous embedded metal liners are provided by a discontinuous interface at the bottom of the via located within the interlayer dielectric layer.

18 Claims, 6 Drawing Sheets

ENHANCED MECHANICAL STRENGTH VIA CONTACTS

CROSS-REFERENCE TO RELATED APPLICATION

This application is a continuation of currently co-pending U.S. patent application Ser. No. 11/419,077, filed on May 18, 2006, the subject matter of which is incorporated herein by reference in its entirety.

BACKGROUND OF THE INVENTION

The present invention relates to semiconductor integrated circuits (ICs), and more particularly to a back-end-of-the-line (BEOL) interconnect that has a modified structure that enhances the reliability of the IC. The present invention is also related to a method for fabricating the semiconductor IC structure containing the modified interconnect structure.

Damascene processes are well known methods to form metal features such as lines or vias in semiconductor devices. In a typical damascene process a dielectric layer is deposited on a substrate and a portion of the dielectric is etched away in accordance with a mask pattern. The etched areas in the dielectric layer are lined with a barrier metal and then filled with a metal. Excess liner and metal deposited over the dielectric layer is removed in a planarization process.

The vias and lines may be formed in a separate damascene process known as single damascene. To form a layer of metal lines on a substrate, a dielectric layer is deposited and a portion of the dielectric layer is etched away in accordance to a mask pattern which corresponds to the desired line pattern. A metal liner is then deposited on the dielectric layer and in the etched line areas in the dielectric layer. The etched line areas are then filled with a metal and excess metal and liner on top of the dielectric layer is removed in a planarization process. A layer of vias, or vertical connections, are formed in a similar process with a mask pattern corresponding to the desired via pattern. In a single damascene process to form a layer of vias and lines requires two metal fill steps and two planarization steps.

The vias and lines may also be formed in a dual damascene process. A thicker dielectric layer is deposited on a substrate and the dielectric layer is etched according to a mask pattern which corresponds to both the desired via pattern and the desired line pattern. A liner is deposited on the dielectric layer and in the etched areas in the layer. The etched areas are filled with a metal and the excess metal and liner are removed by a planarization process.

FIGS. 1A-1D illustrate various prior art dual damascene structures. Each of the dual damascene structures shown comprises a first dielectric 100 that includes a metal interconnect or line 110 which extends perpendicular to the plane of the paper. A first patterned cap layer 120 is also present on a surface of the first dielectric 100. A second dielectric 130 is located atop the first dielectric 100. The second dielectric 130 has a dual damascene aperture, which includes a lower portion 148 and an upper portion 150, formed therein. The lower portion 148 is referred to in the art as a via, while the upper portion 150 is referred to in the art as a line.

The dielectrics used in each of the levels are typically comprised of silicon dioxide, a thermosetting polyarylene resin, an organosilicate glass such as a carbon-doped oxide (SiCOH), or any other type of hybrid related dielectric. The via 148 makes contact with the underlying interconnect 110, while the line 150 extends over a significant distance to make contact with other elements of the IC as required by the specific design layout. In the drawings, the portion of the cap layer 120 at the bottom of the via 148 has been removed, usually by a different etching chemistry than that used to etch the second dielectric 130. A patterned hard mask 122 is located atop the second dielectric 130.

It is conventional in the prior art to deposit a liner 140 over the entire interior of the structure before metallization. Liner 140 can be a single layer such as shown in FIG. 1A and FIG. 1C, or multiple layers 140, 145, as shown in FIGS. 1B and 1D. In FIGS. 1C and 1D, the liner 140 is not located on the bottom horizontal surface of the via 148. The liner 140, 145 is comprised of a refractory metal such as, for example, Ta, Ti, and W, or a refractory metal nitride such as TaN, TiN, and WN. An optional adhesion layer, not specifically shown, can be used to enhance the bonding of the liner to the second dielectric layer 130.

A conductive material (not specifically shown) such as Al, W, Cu or alloys thereof is then deposited so as to completely fill the aperture providing conductively filled vias and conductively filled lines.

One major problem with the prior art interconnect structures shown in FIGS. 1A-1D is that it is difficult to obtain a good mechanical contact at normal chip operation temperatures. Additionally, the prior art interconnect structures oftentimes exhibit an open circuit or high resistance joint during reliability testing. Hence, there is a need for providing a new and improved interconnect structure that avoids the problems mentioned above. That is, an interconnect structure is needed that has and maintains good mechanical contact during normal chip operations and does not fail during various reliability tests such as thermal cycling and high temperature baking.

Problems with these prior art approaches has been the failure to make a good mechanical contact at a chip operation temperature. Failures also include an open circuit or a high resistance joint during reliability tests, i.e., thermal cycling, high temperature baking, etc. A major root cause of the failure is related to the thermal expansion coefficient mismatch between the conductive metal material and its surrounding dielectric material. The failure site is often observed at the via contact area.

Therefore, a need exists for a structure that enhances the reliability of the interconnection. An object of the present invention is to provide a novel interconnect structure to address the reliability concerns due to thermal expansion coefficient mismatch between the metal and dielectric.

Another object of the present invention is to provide novel interconnection structures with better technology extendibility for the semiconductor industry.

Another object of the present invention is to provide fabrication methods for creating the novel interconnect structures.

BRIEF SUMMARY OF THE INVENTION

The present invention provides an interconnect structure comprising a first dielectric layer having at least one metallic interconnect embedded therein, a second dielectric layer located on the first dielectric layer, wherein the second dielectric layer has at least one aperture having an upper line region and a lower via region; a first liner located on the vertical and horizontal walls of the aperture and the metallic interconnect;

a first conductive material partially filling the aperture; a second liner located on the remaining vertical and horizontal walls of the aperture and the first conductive material; and a second conductive material filling the remaining vertical and horizontal walls of the aperture.

The metallic interconnect comprises a conductive metal or metal alloy, preferably Cu, W or Al. The first or second dielectric layer preferably has a dielectric constant of about 4.0 or less and preferably comprises $SiO_2$, a polyarylene resin, or an organosilicate glass.

The interconnect structure may further comprise a patterned cap layer on a surface of the first or second dielectric layer that has an opening that exposes a surface portion of the metallic interconnect. The patterned cap layer preferably comprises a nitride, oxynitride or a combination thereof.

The first and second liners may be the same or different diffusion resistant material selected from the group consisting of refractory metals, refractory metal nitrides, Ru, RuTa, RuTaN, Ir, Rh, Pt, and TiNSi. The first and second conductive materials are preferably selected from a group consisting of Cu, Al and CuAl.

The interconnect structure may further comprise a third conductive material partially filling the aperture; and a third liner located on the remaining vertical and horizontal walls of the aperture and the third conductive material. The interconnect structure may further comprise multiple conductive material partially filling the aperture; and multiple liners embedded in the interconnect structure on the multiple conductive material partially filling the aperture.

In another embodiment of the present invention there is provided an interconnect structure comprising: a first dielectric layer having at least one metallic interconnect embedded therein; a second dielectric layer located on the first dielectric layer, wherein the second dielectric layer has at least one aperture having an upper line region and a lower via region; a first liner located on the vertical and horizontal walls of the aperture and the metallic interconnect; a first conductive material partially filling the aperture; a second liner located on the remaining vertical and horizontal walls of the aperture and the first conductive material, the second liner being discontinuous at the bottom horizontal surface of the aperture; and a second conductive material filling the remaining vertical and horizontal walls of the aperture.

The interconnect structure may further comprise a third conductive material partially filling the aperture; and a third liner located on the remaining vertical and horizontal walls of the aperture and the third conductive material. The interconnect structure may further comprise multiple conductive material partially filling the aperture; and multiple discontinuous liners embedded in the interconnect structure on the multiple conductive material partially filling the aperture.

In another embodiment of the present invention there is provided a method of forming an interconnect structure having an embedded liner comprising the steps of: forming a second dielectric layer on a first dielectric layer having a metallic interconnect embedded therein; forming at least one aperture within the second dielectric layer that extends to the metallic interconnect in the first dielectric layer; forming a first liner material in the aperture; partially forming a first conductive material in the aperture; forming a second liner in the remaining portion of the aperture and the first conductive material; and forming a second conductive material in the aperture.

Forming the aperture comprises forming a via opening and a line opening, wherein the via opening is formed prior to the line opening. Forming the aperture comprises forming a via opening and a line opening. The method may further comprise forming a patterned cap layer on a surface of the first dielectric layer prior to forming the second dielectric layer. The method may further comprise forming a patterned hard mask on the second dielectric layer prior to forming the aperture.

In another embodiment of the present invention there is provided a method of forming an interconnect structure having an embedded liner comprising the steps of: forming a second dielectric layer on a first dielectric layer having a metallic interconnect embedded therein; forming at least one aperture within the second dielectric layer that extends to the metallic interconnect in the first dielectric layer; forming a first liner material in the aperture; partially forming a first conductive material in the aperture; forming a second liner in the remaining portion of the aperture and the first conductive material; partially removing the second liner material at a bottom surface of the aperture to create a discontinuous interface, while simultaneously depositing a second discontinuous liner; and forming a second conductive material in the aperture.

The method of partially removing the liner material and simultaneous deposition includes ion bombardment and sputtering. The ion bombardment includes one of Ar, He, Ne, Xe, $N_2$, $H_2$, $NH_3$ or $N_2H_2$. The method may further comprise ion bombardment which leaves a portion of the original deposited liner on a bottom wall of the via so as to form the discontinuous interface. The step of partially removing the liner material and simultaneous deposition may be repeated more than once. The method may further comprise a sputter process which is performed after partially removing the liner material and simultaneous deposition step.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention provides an interconnect structure in which the mechanical strength of the via contact is enhanced by the addition of an embedded metal liner.

Figure 1A:
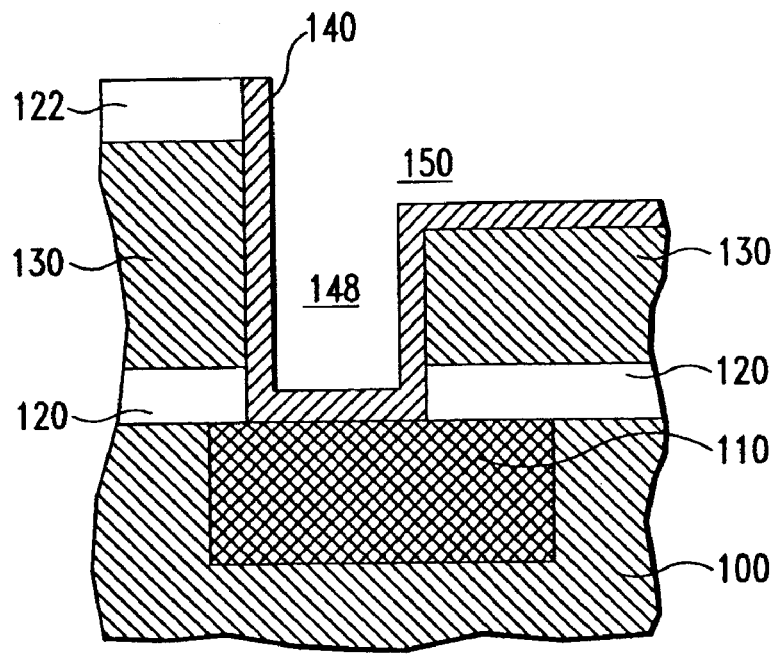
FIGS. 1A-1D are pictorial representations (through cross sectional views) showing various prior art dual damascene interconnect structures.
Figure 1B:
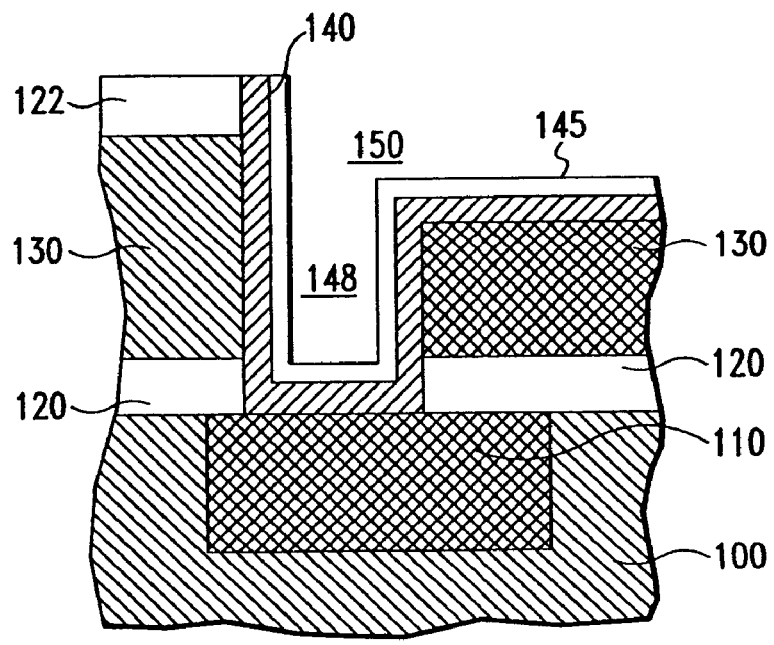
Figure 1C:
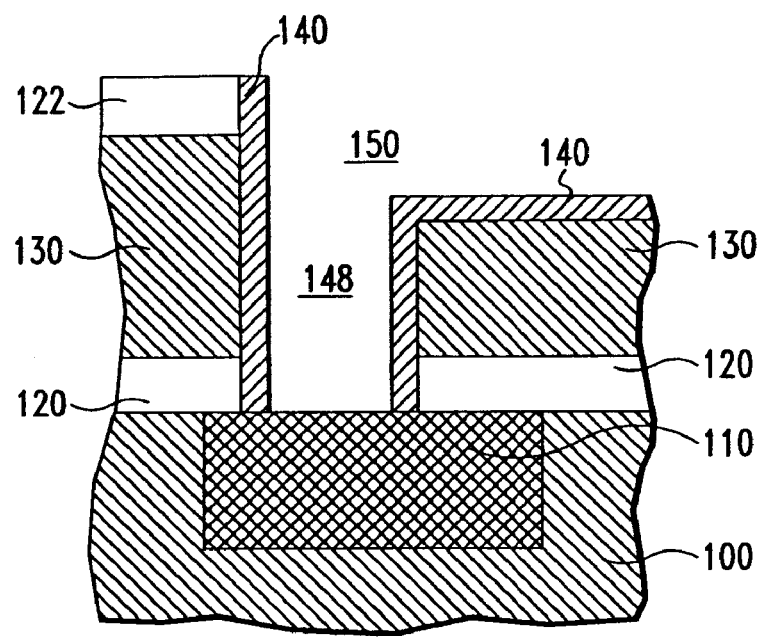
Figure 1D:
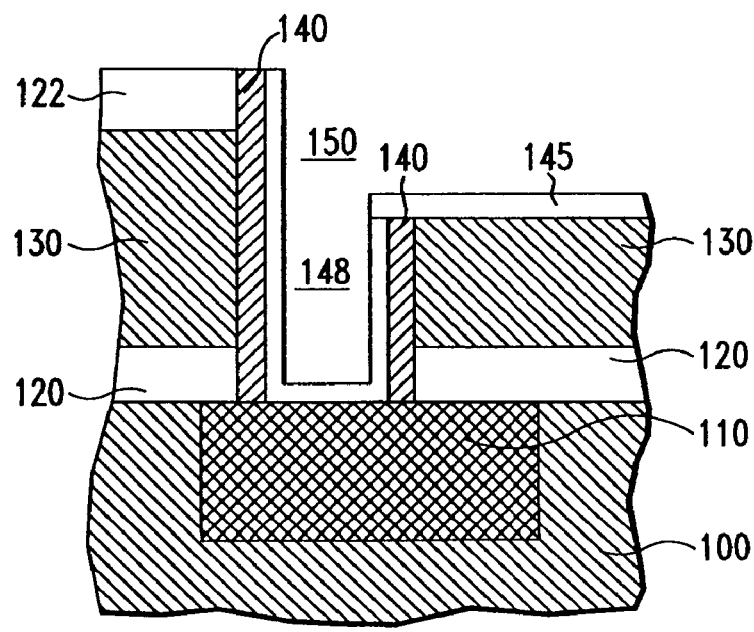
Figure 2:
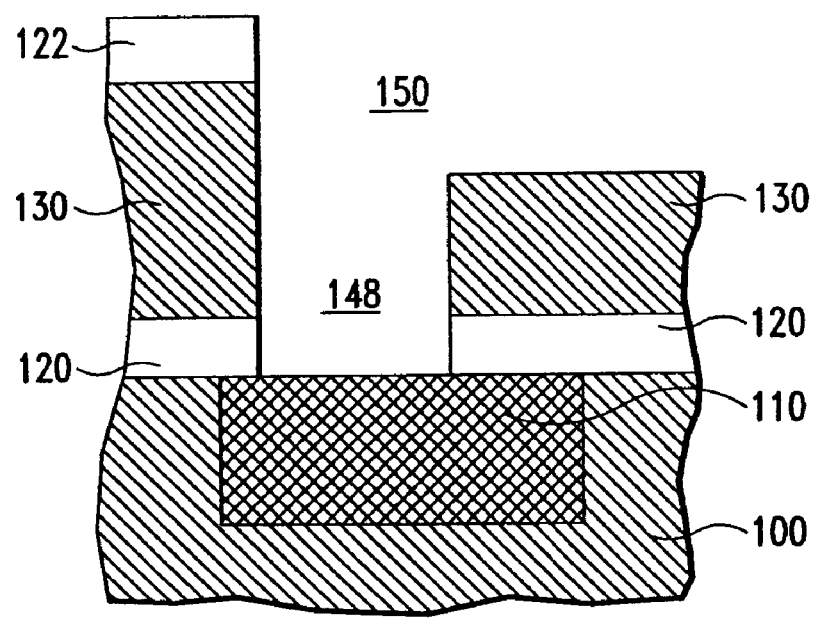
FIG. 2 is a pictorial representation (through a cross sectional view) showing a dual damascene structure of the present invention after forming at least one aperture within the second dielectric layer.

Referring to FIG. 2 there is shown a partial interconnect structure which includes a first (or lower) dielectric layer 100 having a conductive interconnect 110 embedded within a surface of the first dielectric layer 100 and an optional patterned cap 120 having an opening that exposes a surface of the conductive interconnect 110 located on the first dielectric layer 100. The partial interconnect structure shown in FIG. 2 also includes a second dielectric layer 130 that has an optional patterned hard mask 122 located on a surface of the second dielectric layer 130. The second dielectric layer 130 has at least one aperture that comprises an upper line region 150 and a bottom via region 148.

The partial interconnect structure is formed by first forming the first dielectric layer 100 on a substrate (not shown) that includes at least one semiconductor device (also not shown). The at least one semiconductor device includes, for example, a PFET, NFET or a combination thereof. The first dielectric layer 100 is formed by a deposition process including, for example, chemical vapor deposition (CVD), plasma enhanced chemical vapor deposition (PECVD), chemical solution deposition or spin-on coating.

The first dielectric layer 100 comprises any insulator (porous or non-porous) that has a dielectric constant k of about 4.0 or less. The dielectric layer may also comprise a first oxide later, a hardmask layer and a second oxide layer. Illustrative examples of such dielectric materials having a dielectric constant within the recited range include, but are not limited to $SiO_2$, a thermosetting polyarylene resin, an organosilicate glass (OSG) such as a carbon doped oxide that includes atoms of Si, C, O and H, and other like insulators. The term "polyarylene" is used herein to denote aryl moieties or inertly substituted aryl moieties which are linked together by bonds, fused rings, or inert linking groups such as oxygen, sulfur, sulfone, sulfoxide, carbonyl, etc.

The thickness of the first dielectric layer 100 can vary depending upon the type of insulator employed as well as the type of process used to deposit the same. Typically, the first dielectric layer 100 has a thickness from about 50 nm to about 500 nm, with a thickness from about 100 to about 300 nm being more typical.

The metallic interconnect 110, which is embedded within the first dielectric layer 100, extends perpendicular to the plane of the paper. The metallic interconnect 110 is comprised of a conductive metal including, for example, copper (Cu), aluminum (Al), and tungsten (W), or an alloy containing at least a conductive metal. In a preferred embodiment, the metallic interconnect 110 is comprised of Cu.

The metallic interconnect 110 is formed in the surface of the first dielectric layer 100 by lithography and etching. The lithography step includes forming a blanket layer of resist material (not shown) on the surface of the first dielectric layer 100, exposing the blanket resist material to a pattern of radiation and developing the pattern into the resist utilizing a conventional resist developer. The etching step includes any etching process that selectively removes some of the exposed portion of the underlying first dielectric layer 100. Illustratively, the etching used at this point of the present invention includes a dry etching process such as, for example, reactive-ion etching, ion beam etching, plasma etching or combination thereof. The lithography and etching steps define an opening into the first dielectric layer 100 in which the metallic interconnect 110 will be subsequently formed.

Next, a conductive metal such as described above is formed into the at least one opening using a conventional deposition process including, but not limited to: CVD, PECVD, sputtering, chemical solution deposition or plating. A conventional planarization process such as chemical mechanical polishing (CMP) or grinding can be employed after depositing the conductive metal. The planarization process provides a structure in which the metal interconnect 110 has an upper surface that is substantially coplanar with the upper surface of the first dielectric layer 100.

In some embodiments, and when Cu is employed, a cap layer 120 is deposited on the surface of the first dielectric layer 100 after forming the metallic interconnect 110. The optional cap layer 120 comprises a nitride, oxynitride or any combination thereof. The optional cap layer 120 is formed by a deposition process or by a thermal nitridation or oxynitridation process. The optional cap layer 120 typically has a thickness from about 5 to about 90 nm, with a thickness from about 20 to about 60 nm being more typical.

After providing the conductive interconnect 110 into the first dielectric layer 100 (with or without the cap layer 120), a second dielectric layer 130 that may comprise the same or different dielectric material as the first dielectric layer 100 is formed. The second dielectric layer 130 is formed utilizing one of the above mentioned deposition processes that was used in forming the first dielectric layer 100. The thickness of the second dielectric layer 130 may vary depending on the type of dielectric material employed as well as the process used in forming the same. Typically, the second dielectric layer 130 has a thickness from about 200 to about 900 nm, with a thickness from about 400 to about 700 nm being even more typical.

An optional hard mask 122 is then formed atop the second dielectric layer 130. The optional hard mask 122 is typically used when Cu is to be embedded within the second dielectric layer 130. The optional hard mask 122 is comprised of the same or different material as the cap layer 120. The optional hard mask 122 has a thickness that is within the ranges mentioned above for the cap layer 120.

Another resist material (not shown) is then formed atop either the optional hard mask 122 or the second dielectric layer 130 and then lithography is used to provide a patterned resist material. The pattern formed at this point is a via pattern. Next, the via pattern is transferred into the optional hard mask 122, if present, and thereafter into the second dielectric layer 130. The patterned resist is typically removed after the optional hard mask 122 has been etched. The via 148 extends to the surface of the conductive interconnect 110. Hence, if the cap layer 120 is present, it is etched during this step of the present invention. The etching step is similar to the etching step described above in forming the conductive interconnect 110. Specifically, the etching step selectively etches the hard mask 122, the second dielectric layer 130 and, if present the cap layer 120 stopping on a surface of the conductive interconnect 110.

A yet other resist material is then applied and patterned by lithography to provide a line pattern which is transferred into the hard mask 122 and a portion of the second dielectric layer 130 utilizing an etching process. The line pattern is formed into an upper portion of the second dielectric layer 130. In FIG. 2, reference numeral 150 denotes the line. It is noted that the line 150 and via 148 form an aperture or opening within the second dielectric 130 that extends to the upper surface of the conductive interconnect 110. In some embodiments of the present invention, the line 150 can be formed first and then the via 148 can be formed.

Figure 3:
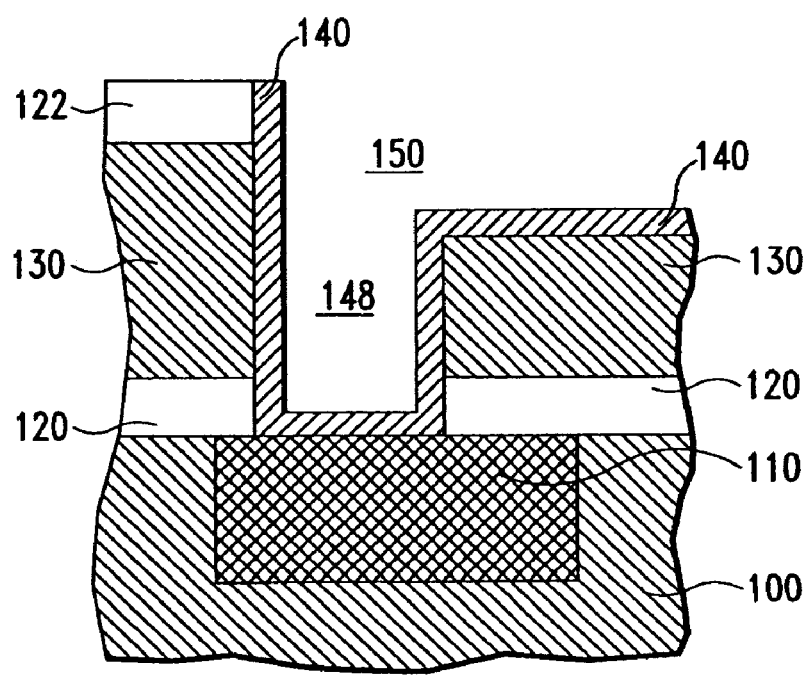
FIG. 3 is a pictorial representation (through a cross sectional view) showing the dual damascene structure of FIG. 2 after forming a liner material within the at least one aperture.

A first liner 140 is then formed on all exposed surfaces (vertical and horizontal) within the aperture created above so as to provide the structure shown in FIG. 3. The first liner 140 is formed by any deposition process including, but not limited to: CVD, PECVD, sputtering, chemical solution deposition or plating. The first liner 140 is comprised of any material that can serve as a barrier to prevent a conductive material from diffusing there through. Illustrative examples of such barrier materials include a refractory metal, such as Ta, Ti, W, Ru, RuTa or nitrides thereof, e.g., TaN, TiN, WN, RuTaN. The first liner 140 may also comprise TiNSi. The thickness of the first liner 140 is typically from about 5 to about 60 nm, with a thickness from about 10 to about 40 nm being more typical.

Figure 4:
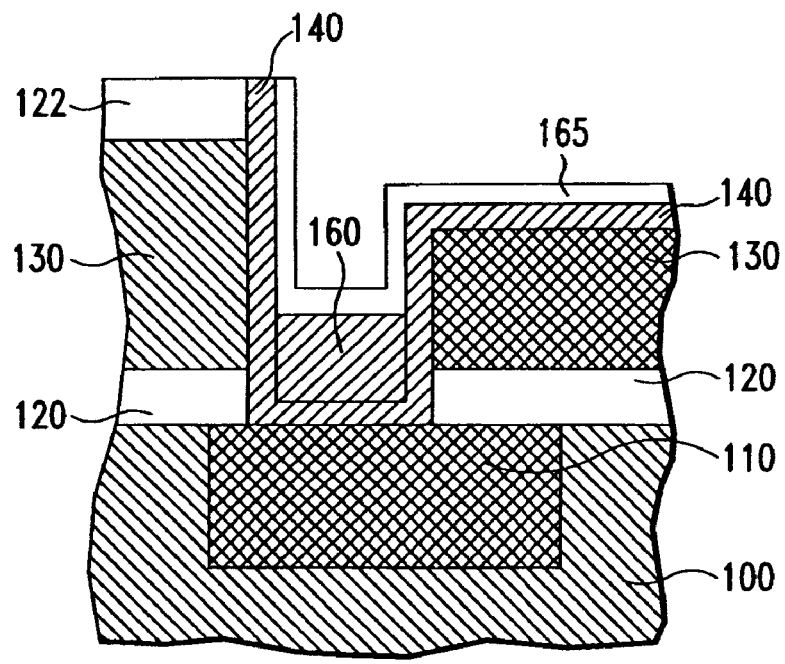
FIG. 4 is a pictorial representation (through a cross sectional view) showing the dual damascene structure after forming the partial fill and second liner.

Referring now to FIG. 4 there is illustrated the deposition of a seed material 141 (not shown), preferably Cu, on the first liner 140. This is followed by a partial electroplating of a conductive material 160, preferably Cu, Al or CuAl. The term "partial electroplating" is used to distinguish this step from a conventional process where in which the via and line aperture are completely filled. In the present invention the conductive material 160 only partially fills the aperture. In the particular examples illustrated in FIG. 4 the conductive material 160 partially fills the via aperture 148. It is apparent that partially filling the aperture to any degree, such as partial via fill, complete via fill and partial line fill, and combinations thereof, are within the scope of the present invention.

A second liner 165 is then formed on all exposed surfaces (vertical and horizontal) within the remaining aperture and conductive material 160 so as to provide the structure shown in FIG. 4. This is followed by the deposition of a seed material (not shown), preferably Cu, on the second liner 165. The second liner 165 is formed by any deposition process including, but not limited to: CVD, PECVD, sputtering, chemical solution deposition or plating. The second liner 165 is comprised of any material that can serve as a barrier to prevent a conductive material from diffusing there through. In a preferred embodiment the second liner 165 is selected from a group consisting of Ta, Ru, Ti, Ir, Rh and Pt with a preferred thickness of approximately 10 to 200 Å.

Figure 5:
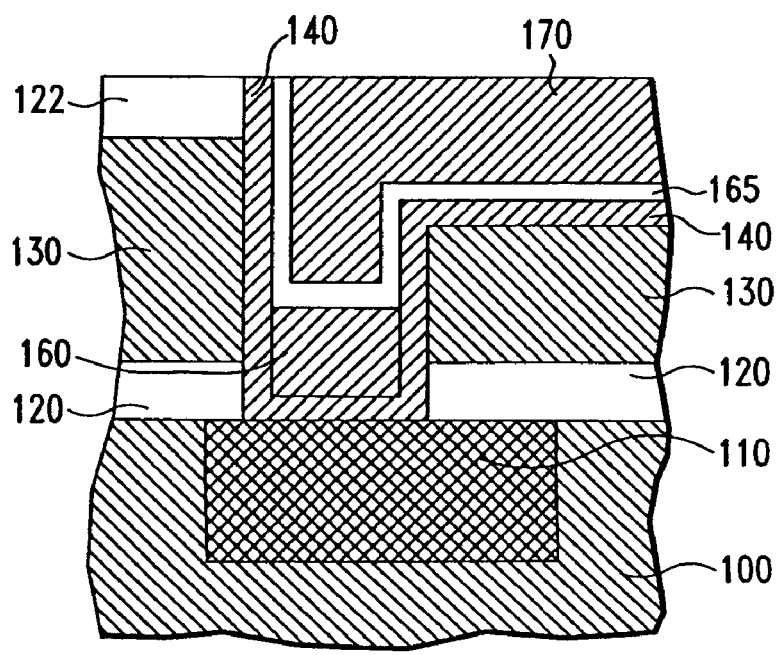
FIG. 5 is a pictorial representation (through a cross sectional view) showing the dual damascene structure after forming the second conductive material.

Next, and as shown in FIG. 5, a conductive material 170 is deposited within the remaining aperture to completely fill the remaining aperture. The conductive material 170 may be the same as conductive material 160. Preferred deposition techniques include electroplating and electroless plating, but the present invention is not limited to these particular deposition techniques. After deposition, a planarization process can be employed such that the upper surface of the conductive material 170 is substantially coplanar with either the upper surface of the second dielectric layer 130 or, if present, the upper surface of the optional hard mask 122. FIG. 5 illustrates a first embodiment of the present invention where the second liner 165 is an embedded metal liner which is continuous across the entire via. Since the embedded liner material 165 has a higher mechanical modulus than the conductive material 160, 170, the liner material 165 enhances the overall mechanical strength and reliability of the interconnect structure.

Figure 6:
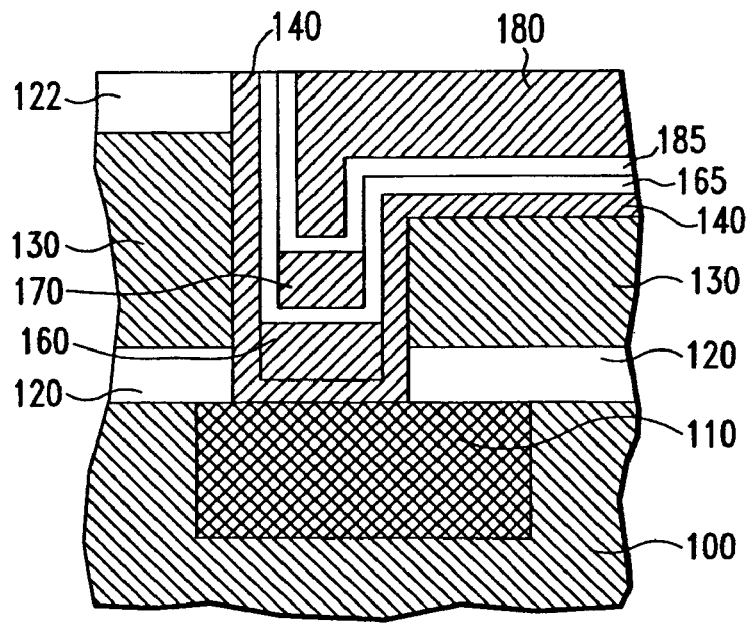
FIG. 6 is a pictorial representation (through a cross sectional view) showing the dual damascene structure after forming multiple embedded liners.

It will be apparent that multiple embedded liners may be provided as shown in FIG. 6. These are readily provided by performing another partial deposition of a conductive material 170 and then forming a third liner 185 on all exposed surfaces (vertical and horizontal) and filling the remaining aperture with conductive material 180. It is apparent that any number of desired embedded metal liners are within the scope of the present invention.

Figure 7:
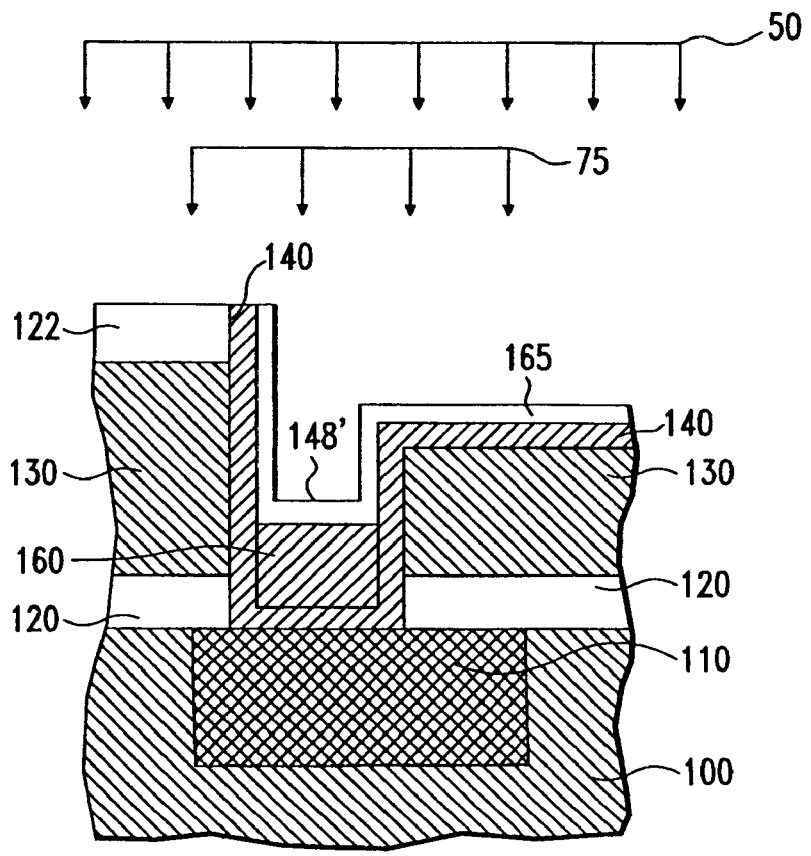
FIGS. 7 and 8 is a pictorial representation (through a cross sectional view) showing the dual damascene structure during and after the simultaneous etching and deposition process.
Figure 8:
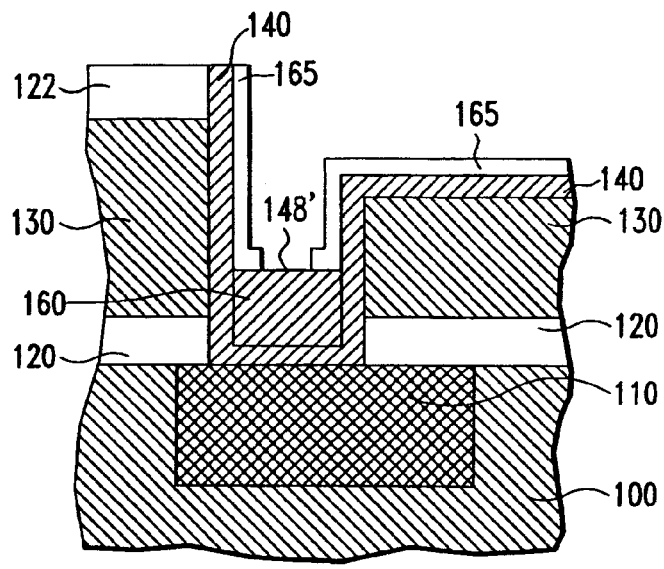

Referring to FIGS. 7 and 8 another preferred embodiment of the present invention is now described. FIG. 7 illustrates the same interconnect structure shown in FIG. 4 after the partial deposition of the conductive material 160. In another preferred embodiment there is shown the simultaneous etching of the second liner 165 from substantially all horizontal surfaces within the aperture. In FIG. 7, reference numeral 50 is used for sputtered ions that are used to etch the second liner 165 from substantially all of the horizontal surfaces within the aperture, while reference numeral 75 denotes the metal neutral of the second liner being deposited. Specifically, the second liner 165 is being deposited with simultaneous ion bombardment which is used to etch the first liner from substantially all of the horizontal surfaces within the aperture. The gas used in ion bombardment includes one of Ar, He, Ne, Xe, $N_2$, $H_2$, $NH_3$, or $N_2H_2$. The second liner 165 formed during the step includes Ta, TaN, Ti, TiN, TiNSi, W, WN, or Ru.

Because the field and trench bottom have higher metal neutral deposition rates than the via bottom 148', a negative etching rate can be achieved at these areas, while a positive etching rate is maintained at via bottom 148'. Thus, the gaseous sputtering partially removes the second deposited liner 165 from the via bottom, without damaging the other areas, i.e., field and trench bottom.

FIG. 8 shows the interconnect structure after the simultaneous ion etching and metal neutral deposition process depicted in FIG. 7 has been performed. As shown, the ion bombardment, i.e., etching, does not completely remove all of the second liner 165 from the bottom via surface 148. Instead, a portion of the second liner 165 is left on the bottom wall of the via. The remaining portion of the second liner 165 within the bottom wall of the via 148 provides a substantially thinner or discontinuous interface 80 within the structure.

FIG. 8 also shows the second liner 165 covers the extensive horizontal surface of the line aperture 150 in order to properly confine the conductive material to be subsequently formed within the aperture (via 148 and line 150). It is possible to have a small amount of the second liner 165 left at the trench bottom 150 (not shown). The bottom surface of the via 148 is shown as being only partially covered with the second liner 165. The second liner 165 can therefore be discontinuous, missing in the central area of the via 148, or continuous but thicker around the perimeter of the via and thinner in the center. In a preferred embodiment the second liner is discontinuous to provide a discontinuous embedded liner. Because the deposition rate is typically higher within the upper liner region 150 than at the bottom of the via 148, the second liner 165 generally has a better (thicker) coverage within the line 150 as compared with the via 148.

Figure 9:
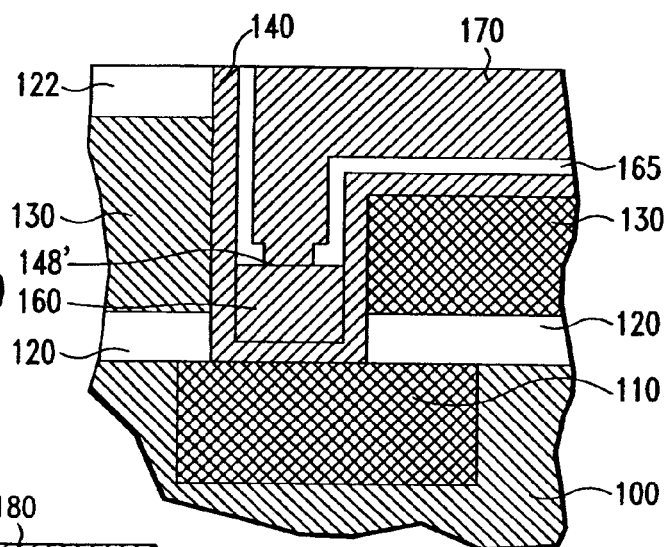
FIG. 9 is a pictorial representation (through a cross sectional view) showing the dual damascene structure after forming the discontinuous embedded liners and forming the second conductive material.

Referring now to FIG. 9, a conductive material 170 is deposited within the remaining aperture to completely fill the remaining aperture. As discussed before the conductive material 170 may be the same as conductive material 160. After deposition, a planarization process can be employed such that the upper surface of the conductive material 170 is substantially coplanar with either the upper surface of the second dielectric layer 130 or, if present, the upper surface of the optional hard mask 122. FIG. 9 illustrates another embodiment of the present invention where the second liner 165 is an embedded metal liner which is discontinuous across the entire via. Since the embedded liner material 165 has an associated increase in resistance, the use of discontinuous embedded liners can be used to tailor the structure so as to minimize the increased resistance for the desired increase in mechanical strength.

Figure 10:
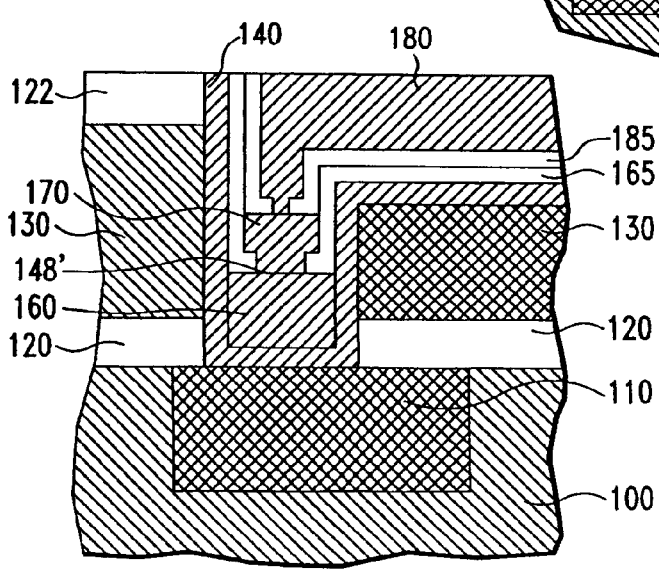
FIG. 10 is a pictorial representation (through a cross sectional view) showing the dual damascene structure after forming multiple discontinuous embedded liners.

It will be apparent that multiple discontinuous embedded liners may be provided as shown in FIG. 10. These are readily provided by performing another partial deposition of a conductive material 170 and then forming a third liner 185 on all exposed surfaces (vertical and horizontal) and filling the remaining aperture with conductive material 180. It is apparent that any number of desired discontinuous embedded metal liners are within the scope of the present invention. Further, any combination of continuous and discontinuous embedded metal liners may be provided in the interconnect structure.

It should be noted that in the above drawings only a single interconnect 110 and a single aperture are shown. Despite showing the presence of a single interconnect 110 and a single aperture, the present invention contemplates forming numerous interconnect and apertures within an interconnect structure. Moreover, it is also contemplated to form addition dielectrics containing embedded conductive material atop the structures depicted in FIGS. 8 and 9 to provide multilevel interconnect structures.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An interconnect structure comprising:
   a first dielectric layer having at least one metallic interconnect embedded therein;
   a second dielectric layer located atop said first dielectric layer, wherein said second dielectric layer has at least one aperture having an upper line region and a lower via region;
   a first liner located atop the vertical and horizontal walls of said at least one aperture and said at least one metallic interconnect, wherein said first liner is substantially absent from a bottom wall of said lower via region;
   a first conductive material partially filling said at least one aperture;
   a second liner located atop the remaining vertical and horizontal walls of said at least one aperture and said first conductive material; and
   a second conductive material filling said remaining vertical and horizontal walls of said at least one aperture.

2. The interconnect structure of claim 1 wherein said metallic interconnect comprises a conductive metal or metal alloy.

3. The interconnect structure of claim 2 wherein said metal is Cu, W or Al.

4. The interconnect structure of claim 1 wherein said metallic interconnect comprises Cu.

5. The interconnect structure of claim 1 wherein said first dielectric layer has a dielectric constant of about 4.0 or less.

6. The interconnect structure of claim 5 wherein said first dielectric layer comprises SiO2, a polyarylene resin, or an organosilicate glass.

7. The interconnect structure of claim 1 further comprising a patterned cap layer on a surface of said first dielectric layer, said patterned cap layer having an opening that exposes a surface portion of said metallic interconnect.

8. The interconnect structure of claim 7 wherein said patterned cap layer comprises a silicon nitride, silicon oxynitride, silicon carbide, or a combination thereof.

9. The interconnect structure of claim 1 wherein said second dielectric layer has a dielectric constant of about 4.0 or less.

10. The interconnect structure of claim 9 wherein said second dielectric layer comprises SiO2, a polyarylene resin, or an organosilicate glass.

11. The interconnect structure of claim 1 further comprising a patterned hard mask on a surface of said second dielectric layer.

12. The interconnect structure of claim 11 wherein said patterned hard mask comprises a nitride, oxynitride or a combination thereof.

13. The interconnect structure of claim 1 wherein said first and second liners comprise the same or different diffusion resistant material selected from the group consisting of refractory metals, refractory metal nitrides, Ru, RuTa, RuTaN, Ir, Rh, Pt and TiNSi.

14. The interconnect structure of claim 1 wherein said first liner extends over a surface portion of the metallic interconnect.

15. The interconnect structure of claim 1 wherein said first and second conductive materials are selected from a group consisting of Cu, Al and CuAl.

16. The interconnect structure of claim 1 wherein said first and second conductive materials comprise Cu.

17. The interconnect structure of claim 1 further comprising a third conductive material partially filling said at least one aperture; and
   a third liner located atop the remaining vertical and horizontal walls of said at least one aperture and said third conductive material.

18. The interconnect structure of claim 17 further comprising multiple conductive material partially filling said at least one aperture; and
   multiple liners embedded in the interconnect structure atop said multiple conductive material partially filling said at least one aperture.

* * * * *